United States Patent
Vashchenko et al.

(10) Patent No.: US 6,586,317 B1
(45) Date of Patent: Jul. 1, 2003

(54) METHOD OF FORMING A ZENER DIODE IN A NPN AND PNP BIPOLAR PROCESS FLOW THAT REQUIRES NO ADDITIONAL STEPS TO SET THE BREAKDOWN VOLTAGE

(75) Inventors: Vladislav Vashchenko, Fremont, CA (US); Andy Strachan, Sunnyvale, CA (US); Peter Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 9 days.

(21) Appl. No.: 09/851,280

(22) Filed: May 8, 2001

(51) Int. Cl.[7] ................................................ H01L 21/04
(52) U.S. Cl. ...................... 438/510; 438/514; 438/522; 438/529; 438/542; 438/983
(58) Field of Search ................................ 438/510, 514, 438/519, 521, 522, 526, 527, 529, 530, 531, 542, 546, 983

(56) References Cited

U.S. PATENT DOCUMENTS

| | | | | |
|---|---|---|---|---|
| 5,807,780 A | * | 9/1998 | Davis et al. ................ | 438/311 |
| 5,856,695 A | * | 1/1999 | Ito et al. .................... | 257/370 |
| 5,892,264 A | * | 4/1999 | Davis et al. ................ | 257/511 |
| 5,994,755 A | * | 11/1999 | DeJong et al. .............. | 257/500 |
| 6,057,578 A | * | 5/2000 | Aiello et al. ................ | 257/355 |
| 6,194,761 B1 | * | 2/2001 | Chiozzi et al. ............. | 257/328 |
| 6,365,932 B1 | * | 4/2002 | Kouno et al. ............... | 257/341 |
| 6,441,445 B1 | * | 8/2002 | Leonardi et al. ........... | 257/378 |

* cited by examiner

Primary Examiner—Matthew Smith
Assistant Examiner—Renzo N. Rocchegiani
(74) Attorney, Agent, or Firm—Mark C. Pickering

(57) ABSTRACT

A zener diode is formed in a bipolar or BiCMOS fabrication process by modifying the existing masks that are used in the bipolar or BiCMOS fabrication process, thereby eliminating the need for a separate doping step. In addition, the reverse breakdown voltage of the zener diode is set to a desired value within a range of values by modifying the area of a new opening in one of existing masks.

21 Claims, 9 Drawing Sheets

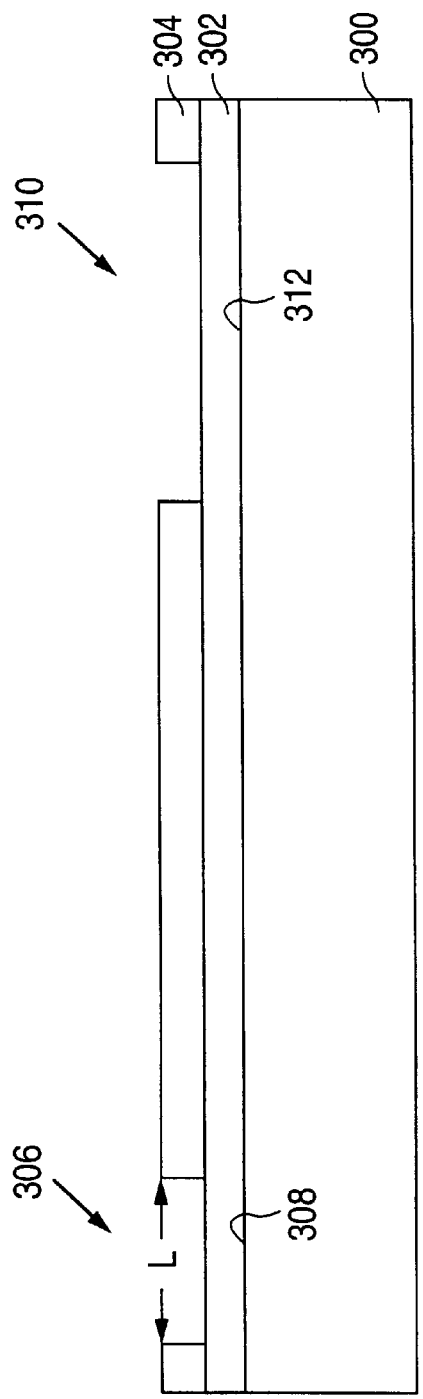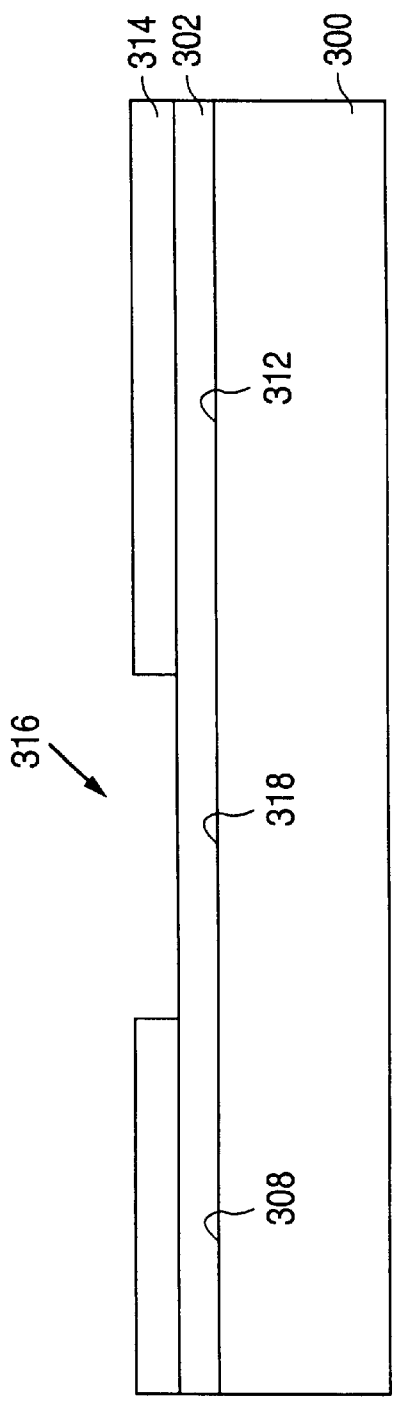

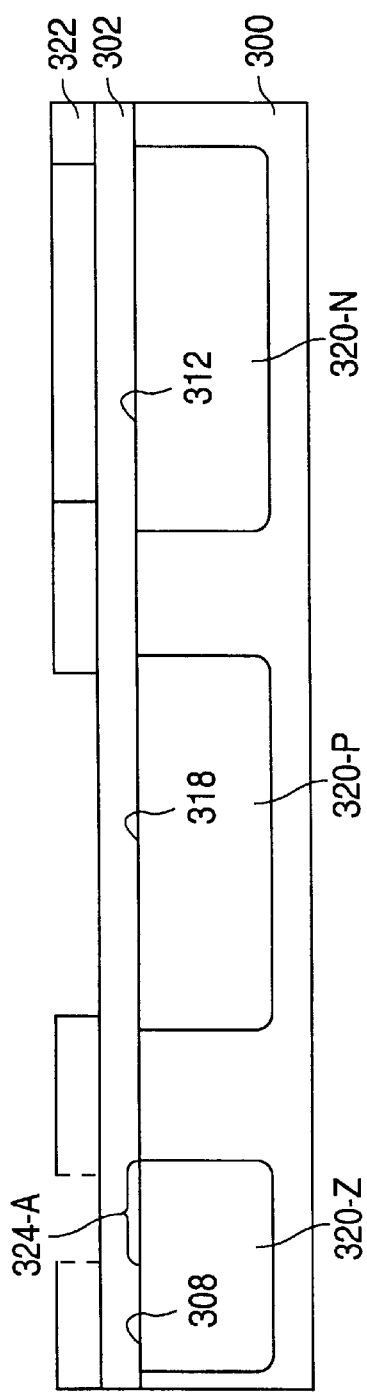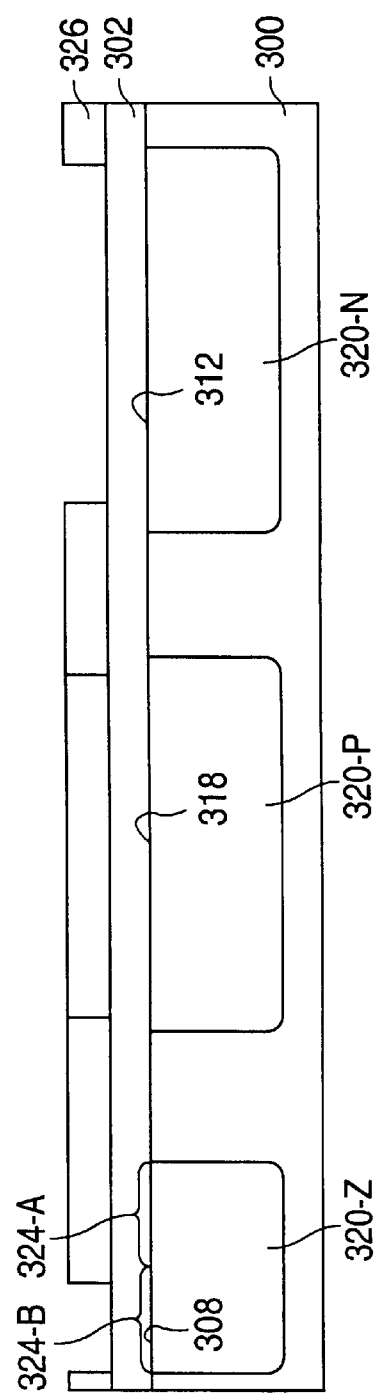
FIG. 3C
FIG. 3D

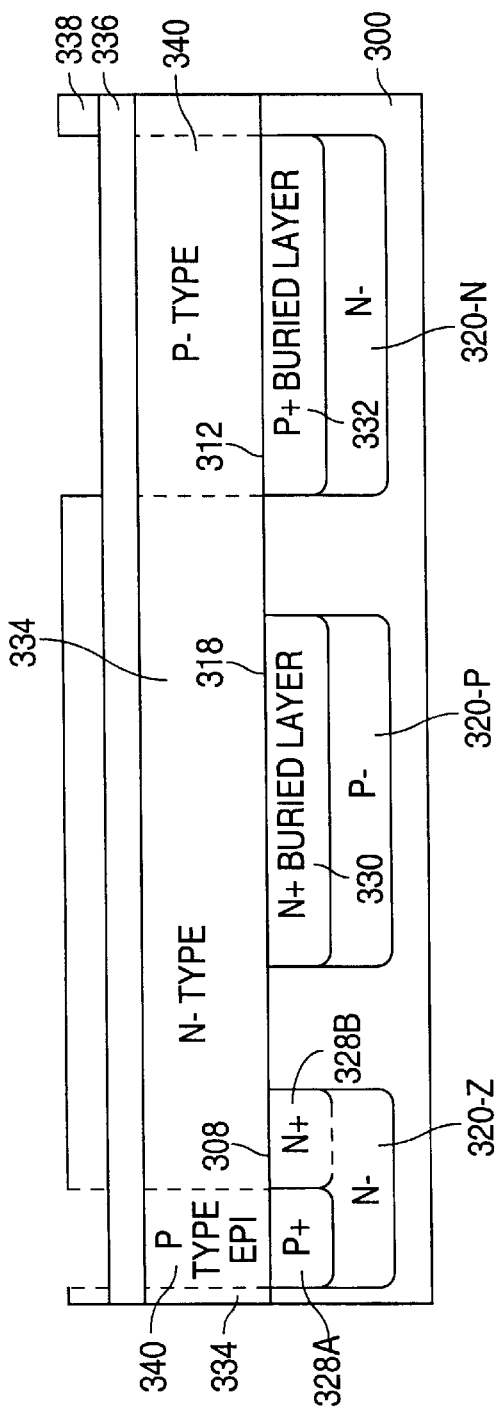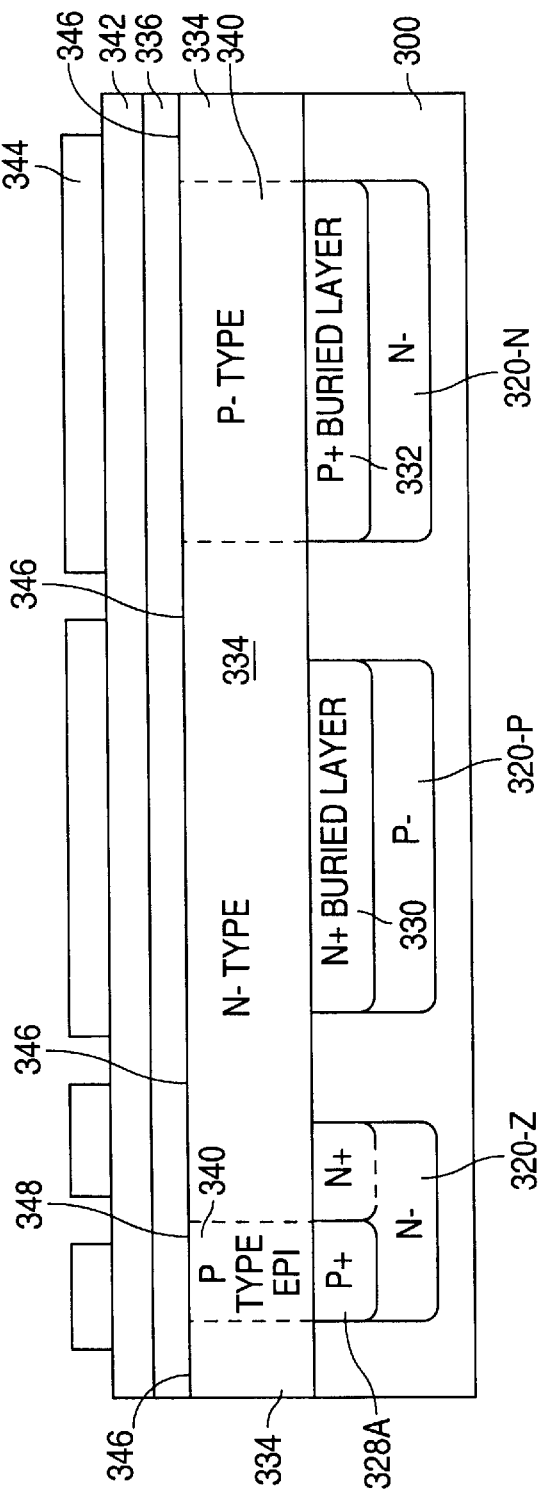
FIG. 3E
FIG. 3F

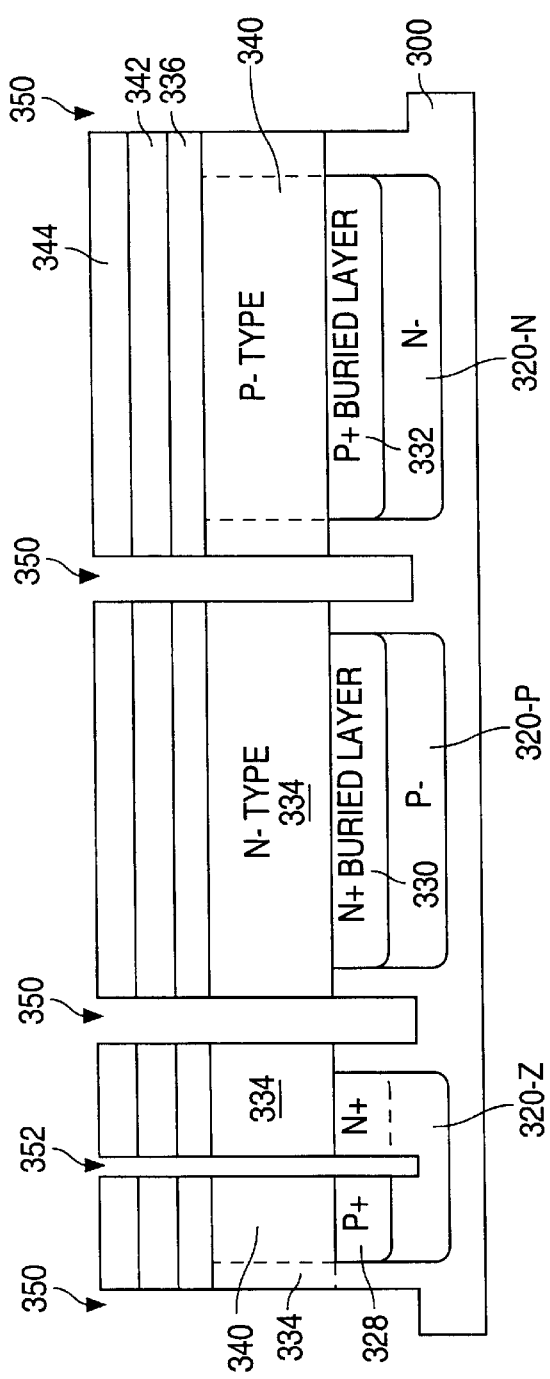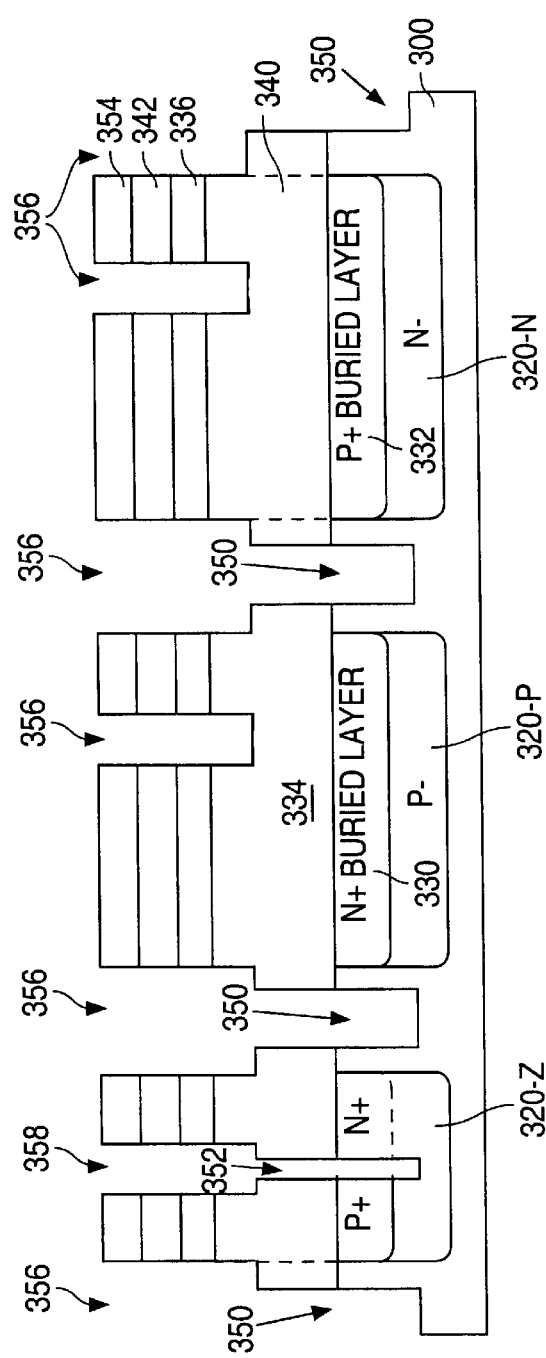

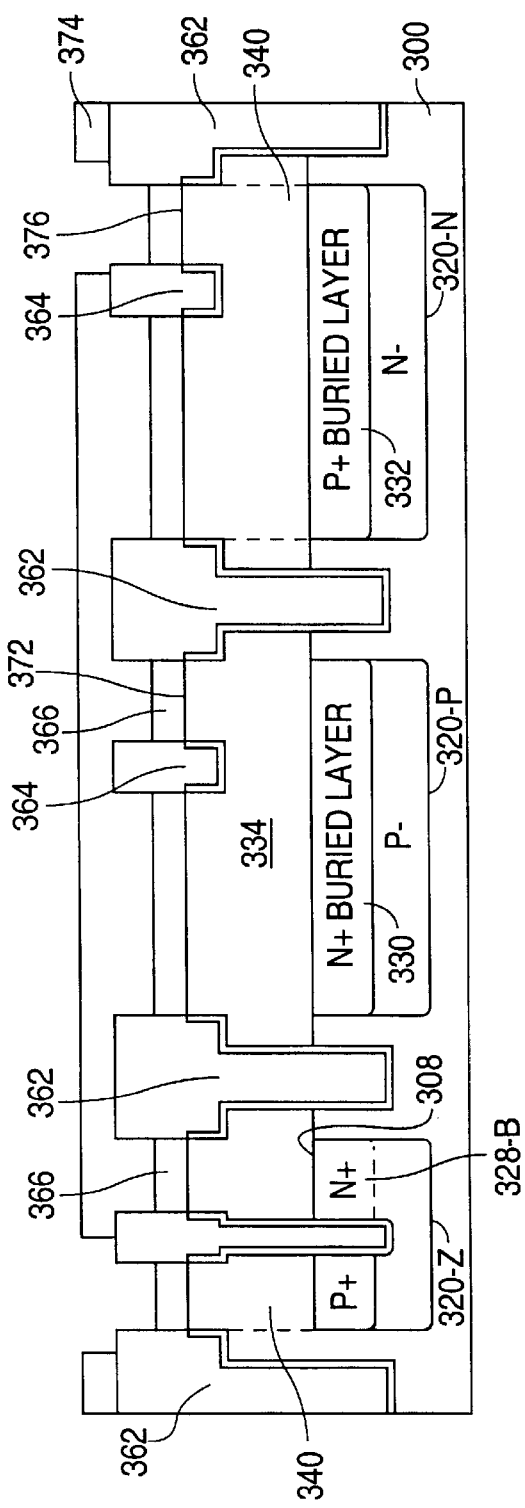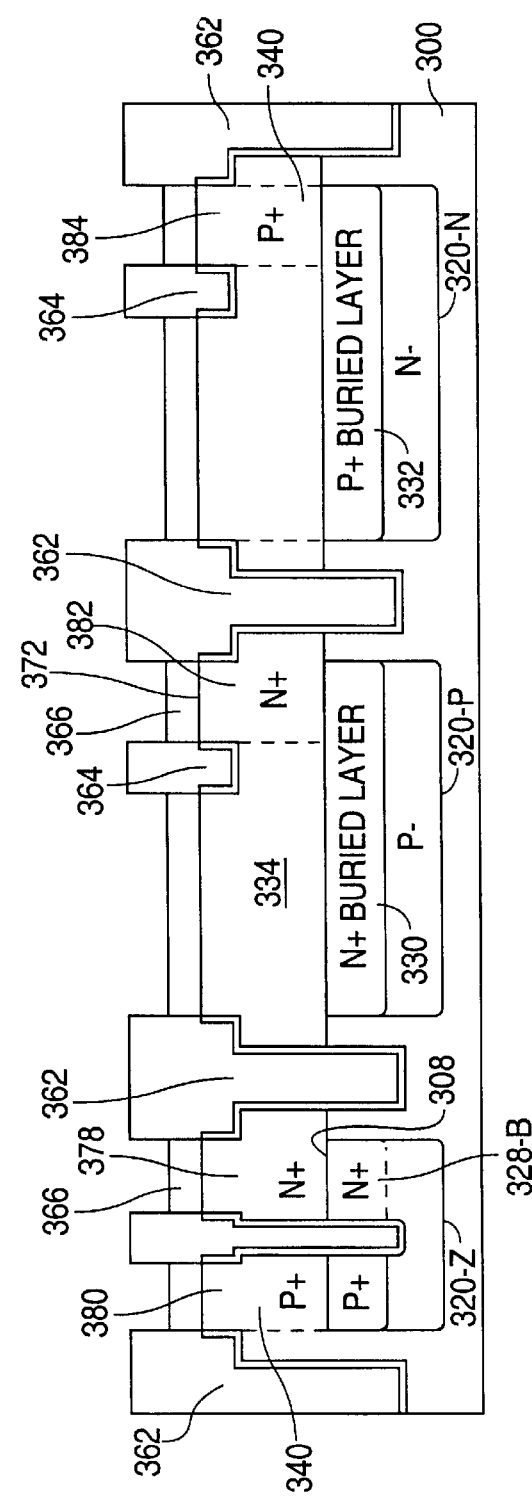
FIG. 3K
FIG. 3L

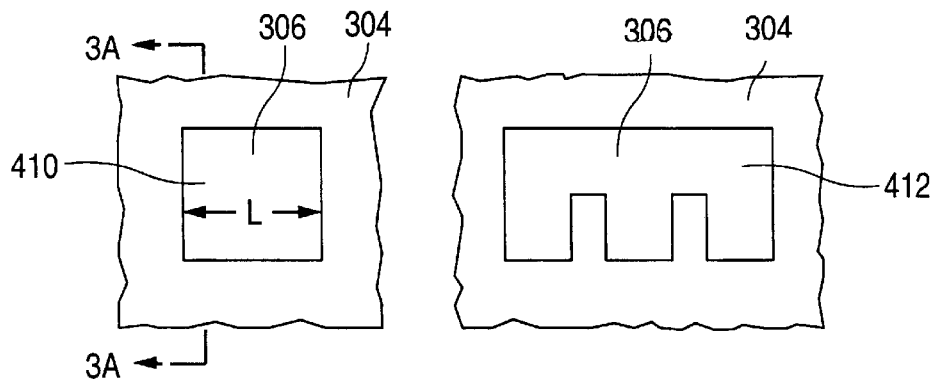
FIG. 4A  FIG. 4B
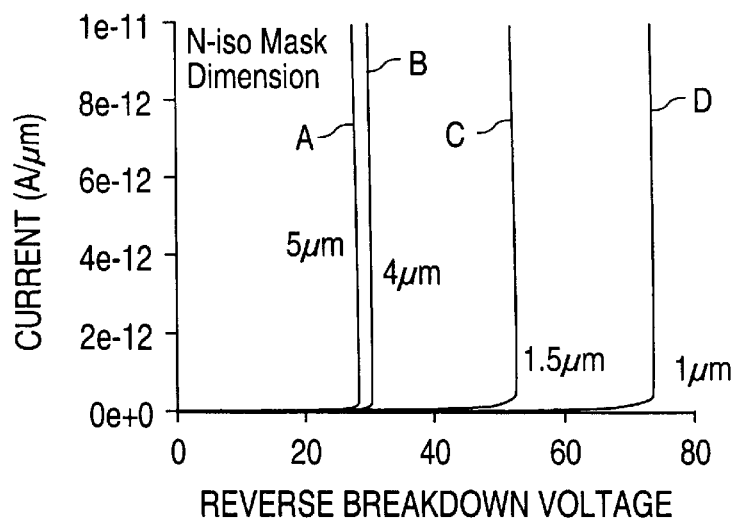
FIG. 5
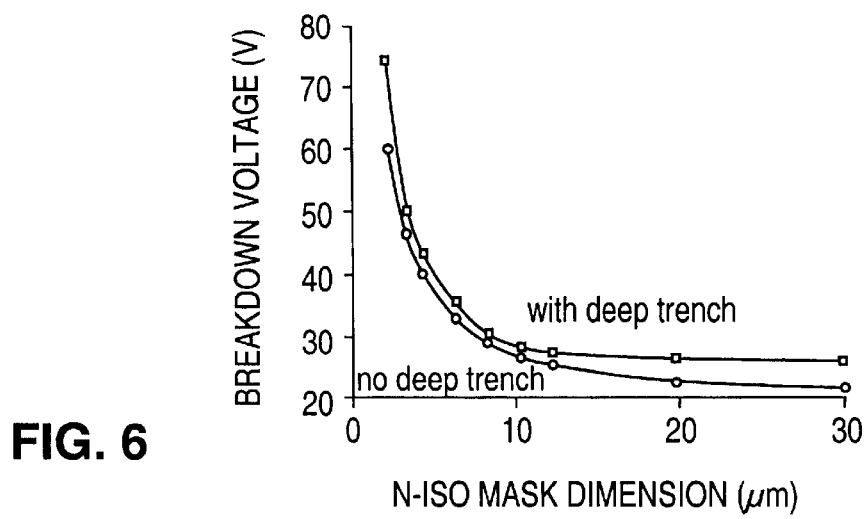
FIG. 6

US 6,586,317 B1

METHOD OF FORMING A ZENER DIODE IN A NPN AND PNP BIPOLAR PROCESS FLOW THAT REQUIRES NO ADDITIONAL STEPS TO SET THE BREAKDOWN VOLTAGE

BACKGROUND OF THE INVENTION

1. Field of the Invention

The present invention relates to a method for forming a zener diode and, more particularly, to a method of forming a zener diode in a npn and pnp bipolar process flow that requires no additional steps to set the reverse breakdown voltage of the zener diode to any voltage within a range of voltages.

2. Description of the Related Art

A zener diode is a p-n junction device that allows substantially no current flow through the diode when the diode is reverse biased (when the voltage on the n region of the diode is greater than the voltage on the p region of the diode.) However, when the n-to-p voltage difference is positive and exceeds a reverse breakdown voltage, a large breakdown current flows through the diode.

The magnitude of the reverse breakdown voltage, in turn, is a function of the relative doping concentrations of the n and p regions of the diode. Thus, by varying the relative doping concentrations, the reverse breakdown voltage can be set to any voltage within a range of voltages.

Zener diodes are commonly formed in a semiconductor process that utilizes a separate doping step to define the relative doping concentrations. The separate doping step typically forms the n or the p region of the diode, or adds a predefined amount of dopant to an existing n or p region, to thereby define the reverse breakdown voltage of the diode.

Zener diodes have a number of uses in semiconductor integrated circuits, including in an electrostatic discharge (ESD) protection circuit that provides ESD protection for variable power supply lines. FIG. 1 shows a circuit diagram that illustrates a conventional ESD protection circuit 100.

As shown in FIG. 1, circuit 100 includes a zener clamp diode 110, a npn transistor 112, and a resistor 114. Transistor 112 has a collector connected to a power supply line 116, a base connected to diode 110 and resistor 114, and an emitter connected to ground. Diode 110 also has a connection to power supply line 116, while resistor 114 also has a connection to ground.

In operation, when the voltage on power supply line 116 is less than the reverse breakdown voltage, essentially no current flows through diode 110. As a result, ground is on the base of transistor 112, thereby turning off transistor 112. When the voltage on power supply line 116 exceeds the reverse breakdown voltage, such as when a human body model (HBM) pulse is applied to line 116, a current flows through diode 110 and resistor 114, thereby placing a voltage on the base of transistor 112. The voltage on the base of transistor 112, in turn, turns on transistor 112, thereby allowing a collector current IC to flow into the collector, and an emitter current IE to flow out of the emitter, of transistor 112.

Although the separate doping step described above is conventionally utilized to form a zener diode, the need for a separate doping step increases the cost and complexity of the fabrication process. Thus, there is a need for a method of forming a zener diode that allows the reverse breakdown voltage to be set to any voltage within a range of voltages without requiring a separate doping step.

SUMMARY OF THE INVENTION

The present invention provides a method of forming a zener diode. The method allows the reverse breakdown voltage of the diode to be set by modifying the existing steps in a bipolar or BiCMOS fabrication process. The present method provides both a high tunable breakdown voltage range and a simple realization.

The method of the present invention begins with the step of forming a first zener region of a first conductivity type in a semiconductor material. The method also includes the steps of forming a second zener region of a second conductivity type in the substrate in the first zener region, and forming a layer of epitaxial material on the semiconductor material. The layer of epitaxial material has a surface, a first region that extends from the surface to the first zener region, and a second region that extends from the surface to the second zener region. The method also includes the step of doping the layer of epitaxial material so that the first region has the first conductivity type and the second region has the second conductivity type.

The method can also include the step of forming first and second transistor buried regions of the first and second conductivity types, respectively, in the semiconductor material. In addition, the method can form a third region of the first conductivity type in the epitaxial layer that extends from the surface to the first transistor buried region.

Further, a fourth region of the second conductivity type is formed in the epitaxial layer to extend from the surface to the second transistor buried region. The method can also form a first base of a second conductivity type that contacts the third region of the epitaxial layer; and a second base of a first conductivity type that contacts the fourth region of the epitaxial layer.

The present invention also provides a semiconductor device that includes a first zener region of a first conductivity type that is formed in a substrate, and a second zener region of the second conductivity type that is formed in the substrate in the first zener region. The semiconductor device also includes an epitaxial layer that is formed on the substrate. The epitaxial layer has a surface, a first region of the first conductivity type that extends from the surface to the first zener region, and a second region of the second conductivity type that extends from the surface to the second zener region.

The semiconductor device can also include a first isolation region of the first conductivity type that is formed in the substrate apart from the zener region. The semiconductor device can further include a first buried region of the first conductivity type that is formed in the substrate in the first isolation region, and a second buried region of the second conductivity type that is formed in the substrate.

The semiconductor device can additionally include, in the epitaxial layer, a third region of the first conductivity type that extends from the surface to the first buried region, and a fourth region of the second conductivity type that extends from the surface to the second buried region. In addition, a first base region of the second conductivity type contacts the third region of the epitaxial layer, and a second base region of the first conductivity type contacts the fourth region of the epitaxial layer.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIGS. 3A–3M are cross-sectional drawings illustrating an example of a method of forming a semiconductor device in accordance with the present invention.

FIGS. 4A and 4B are plan views illustrating two of a number of shapes that zener opening 314 can have after mask 312 has been formed and patterned in accordance with the present invention.

FIG. 5 is a graph illustrating the reverse breakdown voltage of zener diode 430 vs. the current through zener diode 430 for four sizes of zener area 410 in accordance with the present invention.

FIG. 6 is a graph illustrating the reverse breakdown voltage of zener diode 430 vs. the size of opening 314 with and without deep zener trench in accordance with the present invention.

DETAILED DESCRIPTION

Figure 1:
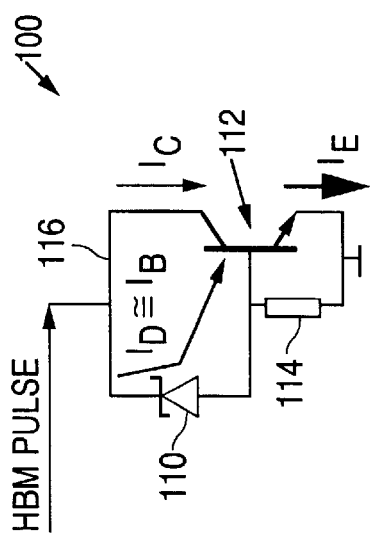
FIG. 1 is a circuit diagram illustrating a conventional ESD protection circuit 100.
Figure 2:
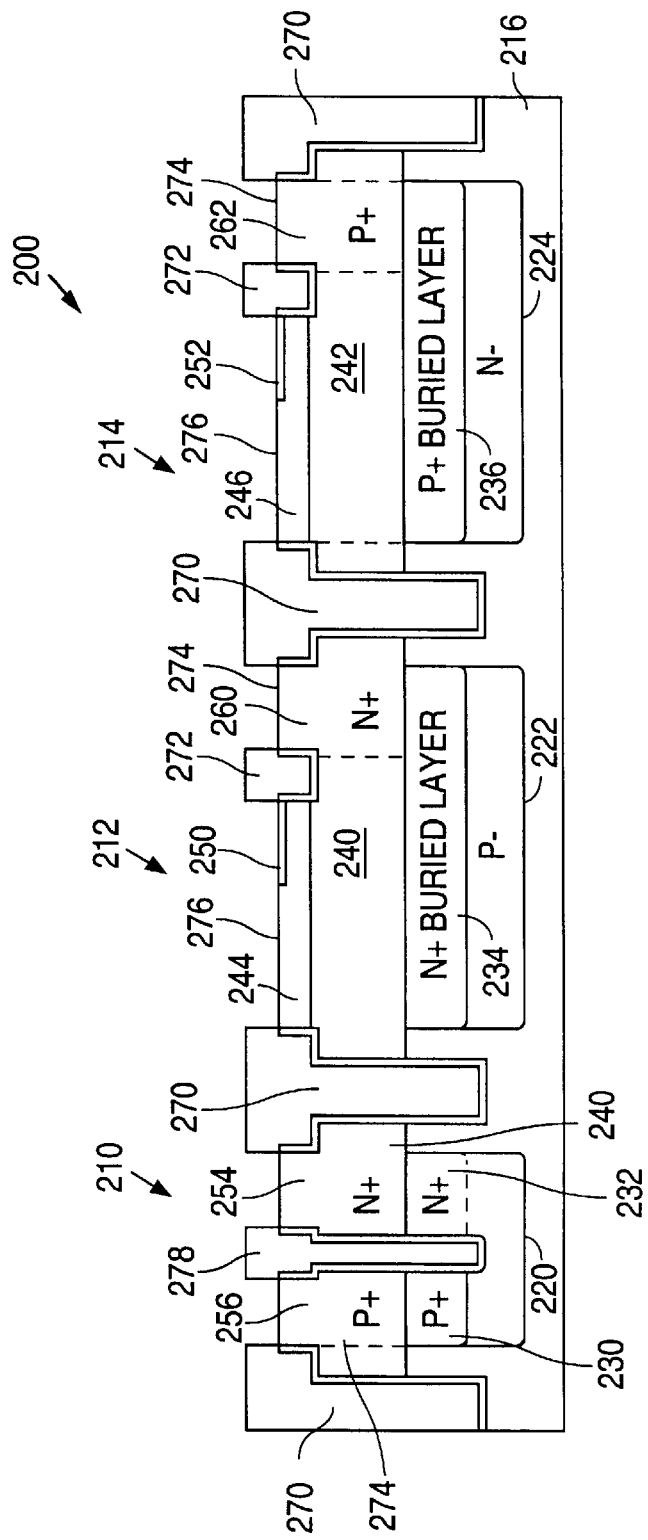
FIG. 2 is a cross-sectional diagram illustrating an example of a semiconductor device 200 in accordance with the present invention.

FIG. 2 shows a cross-sectional diagram that illustrates an example of a semiconductor device 200 in accordance with the present invention.

As shown in FIG. 2, device 200, which is formed on a conventionally-formed substrate 216, includes a n-type zener region 220 that is formed in substrate 216, a p-type isolation region 222 that is optionally formed in substrate 216, and a n-type isolation region 224 that is formed in substrate 216. (If substrate 216 has a p conductivity type of a sufficient dopant concentration, substrate 216 and region 222 can be considered the same.) As described in greater detail below, zener region 220 and isolation region 224 are formed at the same time and, therefore, have substantially the same dopant concentrations.

Device 200 additionally includes a p+ zener region 230 that is formed in n-type zener region 220, and an optional n+ zener region 232 that is formed in zener region 220. Device 200 further includes a n+ buried region 234 that is formed in p-type isolation region 222 (or substrate 216), and a p+ buried region 236 that is formed in n-type isolation region 224. As described in greater detail below, p+ zener region 230 and p+ buried region 236 are formed at the same time and, therefore, have substantially the same dopant concentrations.

Device 200 also includes a n-type region 240 that is formed on substrate 216 over zener region 220 (or optional n+ region 232) and buried region 234, and a p-type region 242 that is formed on substrate 216 over zener region 230 and buried region 236. Region 240 over buried region 234 forms the collector of transistor 212, while region 242 over buried region 236 forms the collector of transistor 214. Device 200 further includes a p– base region 244 that contacts n-type collector region 240 over buried region 234, and a n– base region 246 that contacts p-type collector region 242 over buried region 236.

Device 200 additionally includes a n+ emitter region 250 that is formed in p– base region 244, and a p+ emitter region 252 that is formed in a n– base region 246. In addition, a n+ zener sinker 254 is optionally formed in region 240 to contact n-type zener region 220 or optional n+ region 232, and a p+ zener sinker 256 is optionally formed in region 242 to contact p+ region 230. Further, a n+ sinker 260 is formed in region 240 to contact n+ buried layer 234, and a p+ sinker 262 is formed in region 242 to contact p+ buried layer 236.

Sinkers 254, 256, 260, and 262 reduce the series resistance to n-type zener region 220 (or n+ region 232), p+ region 230, n+ buried region 234, and p+ buried region 236, respectively. Further, deep trench isolators 270 are formed between devices, shallow trench isolators 272 are formed in regions 240 and 242 over buried layers 234 and 236, respectively, to define collector surface areas 274 and base/emitter surface areas 276. In addition, a zener isolator 278 is optionally formed in the center of n-type zener region 220.

FIGS. 3A–3M show cross-sectional drawings that illustrate an example of a method of forming a semiconductor device in accordance with the present invention.

Following this, a n-iso mask 304 is formed and patterned on oxide layer 302. Mask 304 is patterned to have a zener opening 306 that exposes a zener surface 308 of substrate 300 (under oxide layer 302), and a pnp opening 310 that exposes a pnp surface 312 of substrate 300. Zener opening 306, in turn, has a zener area measured on the surface of a plane that passes through substantially all of the surface of mask 304.

FIGS. 4A and 4B show plan views that illustrate two of a number of shapes that zener opening 306 can have after mask 304 has been formed and patterned in accordance with the present invention. As shown in FIG. 4A, mask 304 can be formed such that zener opening 306 has a square shape. In this case, a zener area 410 is defined by squaring a side-length L of opening 306.

As shown in FIG. 4B, mask 304 can alternately be formed such that opening 306 has a multi-fingered shape. In this case, a zener area 412 is defined by the sum of the areas of each of the fingers. (A 5% breakdown voltage increase results for a square mask (represents a multiple cell layout) in comparison with a multiple finger layout.)

Once mask 304 has been patterned, zener surface 308 and pnp surface 312 in FIG. 3A are implanted with a dopant, such as phosphorous or arsenic, through overlying oxide layer 302. The implant forms a first n-type zener implanted region in substrate 300 below zener opening 306, and a first pnp implanted region in substrate 300 below opening 310. Mask 304 is then stripped.

Following this, as shown in FIG. 3B, a p-iso mask 314 is optionally formed and patterned on oxide layer 302 (p-iso mask 314 and the subsequent boron implant are unnecessary if substrate 300 is formed with a p conductivity type and a sufficient dopant concentration). Mask 314 is patterned to have a npn opening 316 that exposes a npn surface 318 of substrate 300 (under oxide layer 302), and to protect zener surface 308 and pnp surface 312. Once p-iso mask 314 has been patterned, npn surface 318 is implanted with a dopant, such as boron, through overlying oxide layer 302. The implant forms a first npn implanted region in substrate 300 below opening 316. P-iso mask 314 is then stripped.

After the implanted regions have been formed, as shown in FIG. 3C, substrate 300 is annealed in a neutral ambient, such as nitrogen. (Other ambients may alternately be used.) The annealing causes the dopants in the zener implanted region to diffuse and form an n-type zener region 320-Z, the first npn implanted region to diffuse and form a p-type isolation region 320-P, and the first pnp implanted region to diffuse and form a n-type isolation region 320-N.

In accordance with the present invention, by varying the area of opening 306 in mask 304 (FIG. 3A), the amount of dopant that is introduced into substrate 300 can be varied. By varying the amount of dopant that is introduced into substrate 300, the doping profile in the center of n-type zener region 320-Z can be varied.

Bipolar and BiCMOS fabrication processes typically include a number of long high-temperature cycles that cause dopant diffusion. The doping profile that results is a function of the total amount of dopant that is available for diffusion which, in turn, is a function of the area of opening 306 in mask 304.

Thus, when the area of opening 306 is relatively small, a first doping profile results, and when the area of opening 306 is relatively large, a second doping profile results. Thus, varying the area of opening 306 varies the amount of dopant available for diffusion which, in turn, varies the doping profile.

Varying the doping profile allows the breakdown voltage of the diode to be varied. As described in greater detail below, a p-type region with a known dopant concentration is subsequently formed to define a p-n junction. Since the p-type region has a known dopant concentration, the reverse breakdown voltage of the diode can be set to any voltage within a range of voltages by varying the doping profile of the n-type region.

Returning to FIG. 3C, a first buried layer mask 322 is next formed on oxide layer 302. Mask 322 is patterned to expose npn surface 318 under oxide layer 302. Following this, npn surface 318 is implanted with a dopant, such as phosphorous or arsenic, through overlying oxide layer 302. The implant forms a second npn implanted region at the surface of isolation region 320-P (or in substrate 300 if region 320-P is not formed).

Mask 322 can also be patterned to expose a first surface portion 324-A of zener surface 308. When mask 322 is patterned to expose portion 324-A, the implant also forms a second zener implanted region at the surface of zener region 320-Z. Mask 322 is then stripped.

As shown in FIG. 3D, a second buried layer mask 326 is formed on oxide layer 302 after mask 322 has been removed. Mask 326 is patterned to expose a second portion 324-B of zener surface 308 and pnp surface 312 under oxide layer 302, and protect first portion 324-A of zener surface 308 and npn surface 318.

Following this, second portion 324-B of zener surface 308 and pnp surface 312 are implanted with a dopant, such as boron, through oxide layer 302. The implant forms a third zener implanted region at the surface of zener region 320-Z, and a second pnp implanted region at the surface of isolation region 320-N. Mask 326 is then stripped.

After the implanted regions have been formed, as shown in FIG. 3E, substrate 300 is again annealed in a neutral ambient. (Other ambients may also be used.) This annealing step causes the dopants in the third zener implanted region to diffuse and form a p+ region 328-A in zener region 320-Z. In addition, if a second zener implanted region was formed at the surface of zener region 320-Z, then the anneal causes the dopants in the second zener implanted region to diffuse and form a n+ region 328-B in zener region 320-Z.

The step also causes the dopants in the second npn implanted region to diffuse and form a n+ buried region 330 in isolation region 320-P (or substrate 300 if region 320-P is not present), and the second pnp implanted region to diffuse and form a p+ buried region 332 in isolation region 320-N. This annealing step is shorter than the prior annealing step and, as a result, causes less diffusion.

Following this, sacrificial oxide layer 302 is removed, and a n-type epitaxial layer 334 is grown on substrate 300 using conventional epitaxial preparation and growth steps. After region 334 has been formed, a layer of sacrificial oxide 336 is formed on n− region 334. Next, a mask 338 is formed and patterned on oxide layer 336.

Mask 338 is patterned to expose the area of n− region 334 (under oxide layer 336) that overlies pnp surface 312, and protect the areas of region 334 that overlie zener surface 308 and npn surface 318. Mask 338 can also be patterned to expose the area of region 334 (under oxide layer 336) that overlies p+ region 328-A. The area overlying pnp surface 312 is then implanted with a dopant, such as boron, through oxide layer 336 to form a p-type implanted region.

When mask 338 is also patterned to expose the area of region 334 that overlies p+ region 328-A, the area overlying the surface of p+ region 328-A is also implanted to form a p-type implanted region. Mask 338 is then removed. Substrate 300 is then annealed in a neutral ambient (other ambients may also be used), thereby causing the dopants in the p-type implanted regions to diffuse and form a p− region 340. The area of region 334 formed over n+ buried region 330 forms the collector of transistor 212, while the area of region 340 formed over p+ buried region 332 forms the collector of transistor 214.

Next, as shown in FIG. 3F, a layer of nitride 342 is formed on oxide layer 336. After this, a deep trench mask 344 is formed and patterned on nitride layer 342. Mask 344 is patterned to expose a trench surface 346 on n− collector region 334. In addition, mask 344 can also be patterned to expose a zener surface region 348 over the surface junction of p+ region 328-A, and zener surface 308 or n+ region 328-B when formed.

As shown in FIG. 3G, once mask 344 has been patterned, the exposed regions of nitride layer 342 and the underlying oxide layer 336 and substrate 300 are etched for a predetermined period of time to form deep trenches 350. When mask 344 is patterned to expose the surface junction, the etch also forms deep zener trench 352. Mask 344 is then stripped.

After this, as shown in FIG. 3H, a shallow trench mask 354 is formed and patterned on nitride layer 342. Mask 354 is patterned to expose shallow trench regions over deep trenches 350, a shallow trench region over n− collector region 334, and a shallow trench region over p-type collector region 340. Mask 354 can also be patterned to expose a shallow trench region over deep zener trench 352. Once mask 354 has been patterned, the exposed regions are etched for a predetermined period of time to form shallow trenches 356 and, when the pattern is present, a shallow zener trench 358 over deep zener trench 352. (The etch also enlarges the size of trenches 350 and 352.) Mask 354 is then stripped.

Figure 3I:
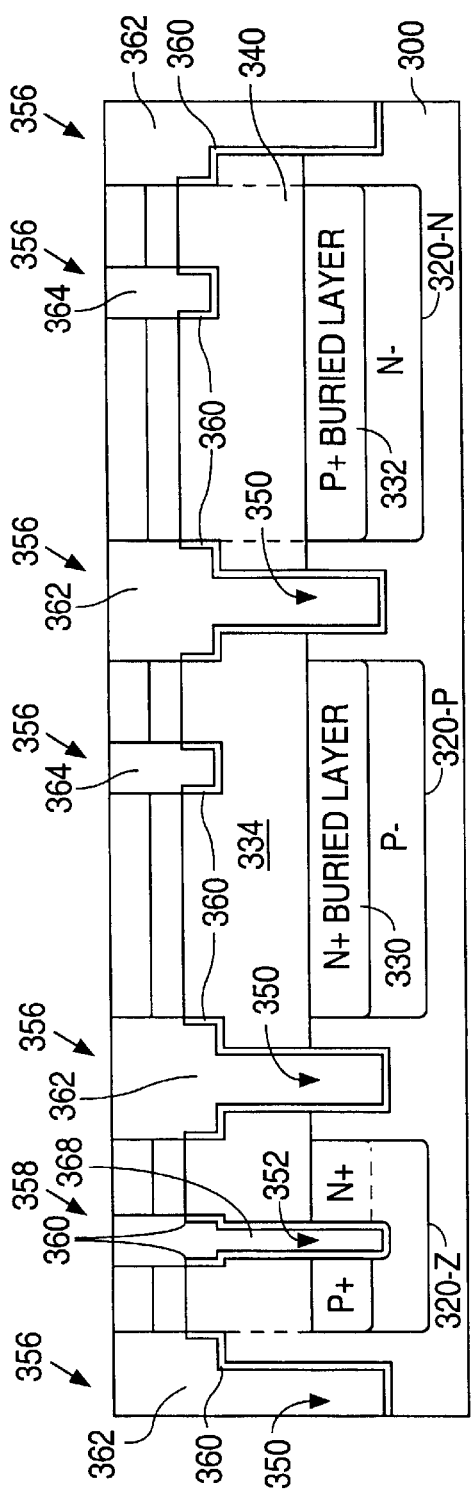

Following this, as shown in FIG. 3I, a layer of liner oxide 360 is grown in trenches 350, 352, 356, and 358. Next, a layer of oxide is formed on nitride layer 342 to fill up trenches 350, 352, 356, and 358. The oxide layer is then planarized using conventional techniques, such as chemical-mechanical-polishing, to remove the oxide layer from the surface of nitride layer 342, and form deep isolation regions 362 and shallow isolation regions 364. If zener trenches 352 and 358 were formed, the planarization also forms zener isolation region 368.

Figure 3J:
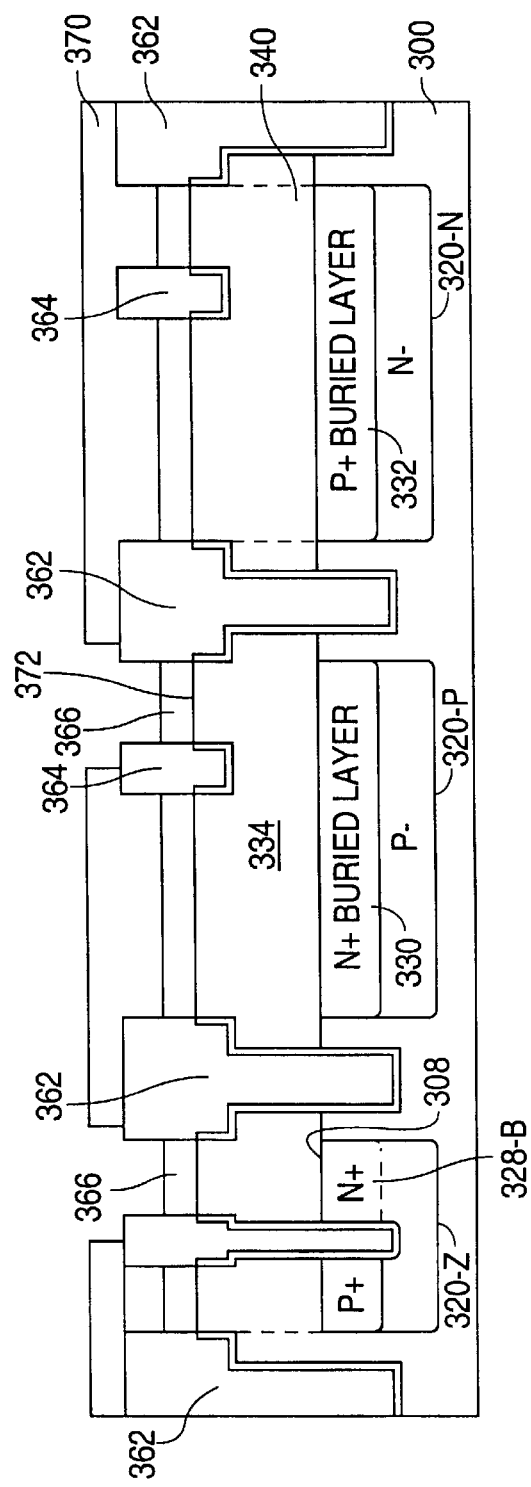

As shown in FIG. 3J, after the planarization, nitride layer 342 is removed. Next, a n+ sinker mask 370 is formed and patterned on oxide layer 366. Mask 370 is patterned to expose the area of collector region 334 that is formed over a collector surface 372 between deep isolation region 362 and shallow isolation region 364 over n+ buried layer 330.

Mask 370 is also patterned to expose the area of collector region 334 formed over zener surface 308 or n+ region 328-B if formed.

Once mask 370 has been patterned, the exposed regions of oxide layer 336 are implanted with a dopant, such as phosphorous or arsenic, to form a first collector implanted region in n-type region 334 over n+ buried layer 330. The implant also forms a first zener implanted region in n- region 334 over zener surface 308, or n+ region 328-B if formed. Mask 370 is then removed.

As shown in FIG. 3K, a p+ sinker mask 374 is formed and patterned on oxide layer 336. Mask 374 is patterned to expose the area of region 340 that is formed over a collector surface 376 between deep isolation region 362 and shallow isolation region 364 over p+ buried layer 332. Mask 374 is also patterned to expose the area of region 340 that is formed over p+ region 328-A.

Once mask 374 has been patterned, the exposed regions of oxide layer 336 are implanted with a dopant, such as boron, to form a second collector implanted region in p-type region 340 over p+ buried layer 332. The implant also forms a second zener implanted region in p-type region 340 over p+ region 328-A. Mask 374 is then removed.

After the implanted regions have been formed, as shown in FIG. 3L, substrate 300 is annealed in a neutral ambient, such as nitrogen. (Other ambients can also be used.) The annealing causes the dopants in the first zener implanted region to diffuse and form a n+ zener sinker region 378, and the second zener implanted region to diffuse and form a p+ zener sinker region 380. The annealing also causes the first collector implanted region to diffuse and form a n+ bipolar sinker region 382, and the second collector implanted region to diffuse and form a p+ bipolar sinker region 384.

Figure 3M:
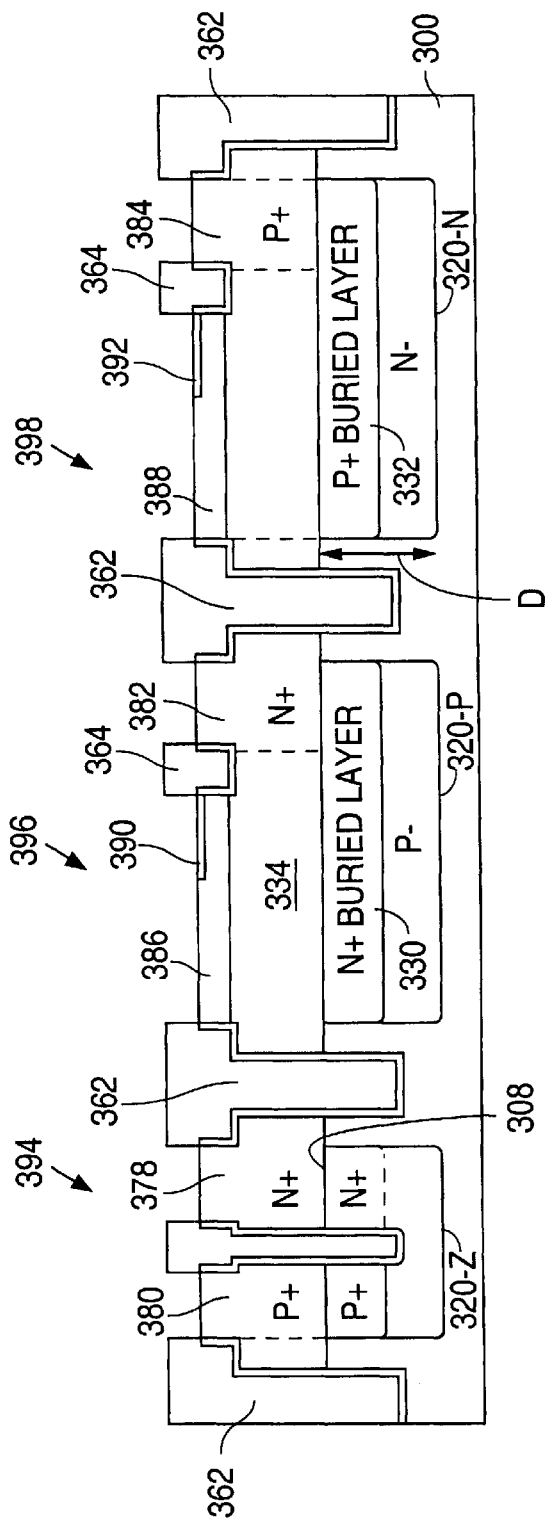

Following this, the process continues with conventional steps. As shown in FIG. 3M, these steps include the formation of a p– base region 386 in collector region 334 over n+ buried layer 330, and a n– base region 388 in collector region 340 over p+ buried layer 332. Although FIG. 3M shows base regions 386 and 388 formed in collector region 334 and collector region 340, respectively, the present method applies equally well to other base structures, including reduced-size base structures, grown base structures, and extrinsic base structures.

These conventional steps also include the formation of a n+ emitter region 390 in p– base region 386, and a p+ emitter region 392 in n– base region 388. Although FIG. 3L shows emitter regions 390 and 392 formed in base layers 386 and 388, respectively, the present method applies equally well to other emitter structures, including single and double poly extrinsic emitter structures.

Thus, a method has been shown for forming a zener diode 394, such as diode 210, a npn bipolar transistor 396, such as transistor 212, and a pnp bipolar transistor 398, such as transistor 214. Zener diode 394 includes zener region 320-Z, p+ region 328-A, n+ region 328-B, n+region 378, and p+ region 380.

Npn bipolar transistor 396 includes isolation region 320-P, n+ buried region 330, collector region 334, sinker 382, p– base 386, and n+ emitter 390. Pnp bipolar transistor 398 includes isolation region 320-N, p+ buried region 332, collector region 340, sinker 384, n– base 388, and p+ emitter 392.

In accordance with the present invention, the reverse breakdown voltage of zener diode 394 is set by varying the size of the zener area, such as zener area 410 or 412. FIG. 5 shows a graph that illustrates the reverse breakdown voltage of zener diode 394 vs. the current through zener diode 394 for four sizes of zener area 410 in accordance with the present invention.

As shown in FIG. 5, a 5 um by 5 um opening 306 in n-iso mask 304, represented by line A, has a breakdown voltage of approximately 28V, while a 4 um by 4 um opening 306, represented by line B, has a breakdown voltage of approximately 30V. In addition, a 1.5 um by 1.5 um opening 306 in mask 312, represented by line C, has a breakdown voltage of approximately 55V, while a 1 um by 1 um opening 306, represented by line D, has a breakdown voltage of approximately 75V.

FIG. 6 shows a graph that illustrates the reverse breakdown voltage of zener diode 394 vs. the size of opening 306 with and without deep zener isolation 368 in accordance with the present invention. As shown in FIG. 6, the breakdown voltage of varies from approximately 80V down to 20V based on the area of the mask opening, and then becomes substantially constant when the size of opening 306 exceeds a 10 um by 10 um sized opening.

In addition, the value of the breakdown voltage is largely independent of the presence of zener trench isolation 368. As further shown in FIG. 6, with trench isolation 368, a 10 um by 10 um sized opening 306 produces a reverse breakdown voltage of approximately 27V while a 30 um by 30 um sized opening 306 produces a reverse breakdown voltage of the same 27V.

On the other hand, when zener trench isolation 368 is absent, a 10 um by 10 um sized opening 306 produces a reverse breakdown voltage of approximately 27V while a 30 um by 30 um sized opening 306 produces a reverse breakdown voltage of approximately 22V. Overall, a square-shaped opening 306 with a side length ranging from 100 um to 1 um has a reverse breakdown voltage range from approximately 20V to 80V.

In the present invention, after regions 332, 334, and 336 have been formed, each subsequent high temperature step, including the formation of collector region 334 and collector region 340, causes the dopants in isolation regions 320-N and 320-P to further diffuse into substrate 300. For example, in a 0.18-micron fabrication process, regions 320-N and 320-P can have depths D of approximately 12 um when the fabrication process is complete.

It should be understood that various alternatives to the method of the invention described herein may be employed in practicing the invention. For example, rather than continuing to reuse a layer of gate oxide, the layer can be removed and replaced by a new layer. Further, the present method can also be incorporated into a BiCMOS process.

Thus, it is intended that the following claims define the scope of the invention and that methods and structures within the scope of these claims and their equivalents be covered thereby.

What is claimed is:

1. A method of forming a device on a semiconductor material, the method comprising the steps of:

forming a first zener region of a first conductivity type, the first zener region contacting the semiconductor material;

forming a second zener region of a second conductivity type, the second zener region contacting the first zener region; and forming a layer of epitaxial material on the semiconductor material, the layer of epitaxial material having a top surface and a bottom surface, a first region that extends from the top surface to the first zener region, and a second region that extends from the top surface to the second zener region, the first region having the first conductivity type and the second region having the second conductivity type.

2. The method of claim 1 and further comprising the step of forming a first transistor buried region of the second conductivity type, the first transistor buried region contacting the bottom surface of the layer of epitaxial material.

3. The method of claim 2 and further comprising the step of forming a first transistor isolation region of the first conductivity type in the semiconductor material, the first transistor buried region contacting the first transistor isolation region.

4. The method of claim 3 wherein the first zener region and the first transistor isolation region are formed at a same time.

5. The method of claim 2 and further comprising the step of forming a second transistor buried region of the first conductivity type, the second transistor buried region contacting the bottom surface of the layer of epitaxial material.

6. The method of claim 5 and further comprising the step of forming a second transistor isolation region of the second conductivity type in the semiconductor material, the second transistor buried region contacting the second transistor isolation region.

7. The method of claim 5 wherein the epitaxial layer has a third region that extends from the top surface to the second transistor buried region, and a fourth region that extends from the top surface to the first transistor buried region.

8. The method of claim 7 wherein the third region of the epitaxial layer has the first conductivity type and the fourth region of the epitaxial layer has the second conductivity type.

9. The method of claim 8 and further comprising the steps of:
    forming a first base of a second conductivity type that contacts the third region of the epitaxial layer; and
    forming a second base of a first conductivity type that contacts the fourth region of the epitaxial layer.

10. The method of claim 9 and further comprising the steps of:
    forming an emitter of the first conductivity type that contacts the first base; and
    forming an emitter of the second conductivity type that contacts the second base.

11. The method of claim 10 wherein a dopant concentration of the first region of the epitaxial layer is greater than a dopant concentration of the first zener region.

12. The method of claim 2 wherein the second zener region and the first transistor buried region are formed at a same time.

13. The method of claim 1 and further comprising the step of forming a third zener region of the first conductivity type in a surface of the first zener region, the third zener region having a higher dopant concentration than the first zener region.

14. The method of claim 13 and further comprising the step of forming an electrically-isolating region between the second zener region and a portion of the first zener region.

15. The method of claim 13 wherein the third zener region and the second transistor buried region are formed at a same time.

16. The method of claim 1 wherein a dopant concentration of the first region of the epitaxial layer is greater than a dopant concentration of the first zener region.

17. The method of claim 1 and further comprising the step of forming a transistor buried region of the first conductivity type, the transistor buried region contacting the bottom surface of the layer of epitaxial material.

18. The method of claim 17 wherein the epitaxial layer has a third region that extends from the top surface to the transistor buried region, and further comprising the step of forming a base of the second conductivity type that contacts the third region of the epitaxial layer.

19. The method of claim 18 and further comprising the step of forming an emitter of the first conductivity type that contacts the base.

20. The method of claim 1 wherein the step of forming a first zener region further comprises the steps of:
    forming a mask over the semiconductor material, the mask having an opening with an area that defines an exposed region; and
    doping the exposed region to form the first zener region.

21. The method of claim 1 and further comprising the step of forming an electrically-isolating region between the second zener region and the third zener region.

* * * * *

UNITED STATES PATENT AND TRADEMARK OFFICE
CERTIFICATE OF CORRECTION

PATENT NO.    : 6,586,317 B1
DATED         : July 1, 2003
INVENTOR(S)   : Vashchenko et al.

It is certified that error appears in the above-identified patent and that said Letters Patent is hereby corrected as shown below:

Column 10,
Line 16, delete "a portion of the first zener region" and replace with -- the third zener region --.
Line 43, delete "the third zener region" and replace with -- a portion of the first zener region --.

Signed and Sealed this

Sixteenth Day of December, 2003

JAMES E. ROGAN
*Director of the United States Patent and Trademark Office*